(12) United States Patent
Suen et al.

(10) Patent No.: US 8,703,612 B2
(45) Date of Patent: Apr. 22, 2014

(54) PROCESS FOR FORMING CONTACT PLUGS

(75) Inventors: Shich-Chang Suen, Hsin-Chu (TW);
Liang-Guang Chen, Hsin-Chu (TW);
He Hui Peng, Changhua (TW);
Wne-Pin Peng, Zhubei (TW);
Shwang-Ming Jeng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 362 days.

(21) Appl. No.: 13/228,196

(22) Filed: Sep. 8, 2011

(65) Prior Publication Data

US 2013/0065394 A1    Mar. 14, 2013

(51) Int. Cl.
*H01L 21/283* (2006.01)

(52) U.S. Cl.
USPC ........... 438/672; 438/626; 438/631; 438/633; 438/645; 438/671; 257/E21.159

(58) Field of Classification Search
USPC .......................... 438/671, 672; 257/E21.159
See application file for complete search history.

(56) References Cited

U.S. PATENT DOCUMENTS

| | | | |
|---|---|---|---|
| 5,320,706 A | 6/1994 | Blackwell | |
| 5,356,513 A * | 10/1994 | Burke et al. | 438/633 |
| 5,389,194 A | 2/1995 | Rostoker et al. | |
| 5,776,833 A | 7/1998 | Chen et al. | |
| 5,789,360 A | 8/1998 | Song et al. | |
| 6,140,224 A | 10/2000 | Lin | |
| 6,294,460 B1 * | 9/2001 | Subramanian et al. | 438/636 |
| 6,376,376 B1 | 4/2002 | Lim et al. | |
| 6,440,840 B1 * | 8/2002 | Chen | 438/624 |
| 6,569,770 B2 | 5/2003 | Wang et al. | |
| 7,067,015 B2 | 6/2006 | Xia et al. | |
| 7,344,976 B2 * | 3/2008 | Yoshida et al. | 438/639 |
| 2001/0048162 A1 * | 12/2001 | Haruhana et al. | 257/751 |
| 2007/0026657 A1 * | 2/2007 | Lee | 438/597 |

* cited by examiner

*Primary Examiner* — Angel Roman
(74) *Attorney, Agent, or Firm* — Slater & Matsil, L.L.P.

(57) ABSTRACT

A method includes forming an etch stop layer over and contacting a gate electrode of a transistor, forming a sacrificial layer over the etch stop layer, and etching the sacrificial layer, the etch stop layer, and an inter-layer dielectric layer to form an opening. The opening is then filled with a metallic material. The sacrificial layer and excess portions of the metallic material over a top surface of the etch stop layer are removed using a removal step including a CMP process. The remaining portion of the metallic material forms a contact plug.

20 Claims, 7 Drawing Sheets

PROCESS FOR FORMING CONTACT PLUGS

BACKGROUND

The formation of metal patterns, which are used for interconnecting integrated circuit devices on semiconductor substrates, often involves the process of forming a dielectric layer, forming openings in the dielectric layer, filling the openings with a metallic material, and polishing the metallic material. After the polishing, the excess portions of the metallic material outside the openings are removed. The remaining metallic material in the openings thus forms contact plugs, vias, metal lines, or the like.

In the etching step for forming the openings and the subsequent polishing processes (which are sometimes chemical mechanical polish (CMP) processes), the pattern density difference of the metallic material in different regions causes the micro-loading effect, and the manufacturing yield may be adversely affected. For example, in the formation of contact plugs that are connected to the source and drain regions of transistors, there may be a difference in the pattern density of the contact plugs. The difference may cause the excess removal of the etch stop layer, which is used for forming the contact plugs.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A method of forming contact plugs is provided in accordance with an embodiment, and the resulting integrated circuit structure is provided. The intermediate stages of manufacturing exemplary embodiments are illustrated. The variations of the embodiments are discussed. Throughout the various views and illustrative embodiments, like reference numbers are used to designate like elements. Throughout the description, the symbol "M1" may be used to refer to the features in bottom metal layer M1, while the symbol "M0" may be used to refer to the features in a metal layer that is under metal layer M1.

Figure 1:
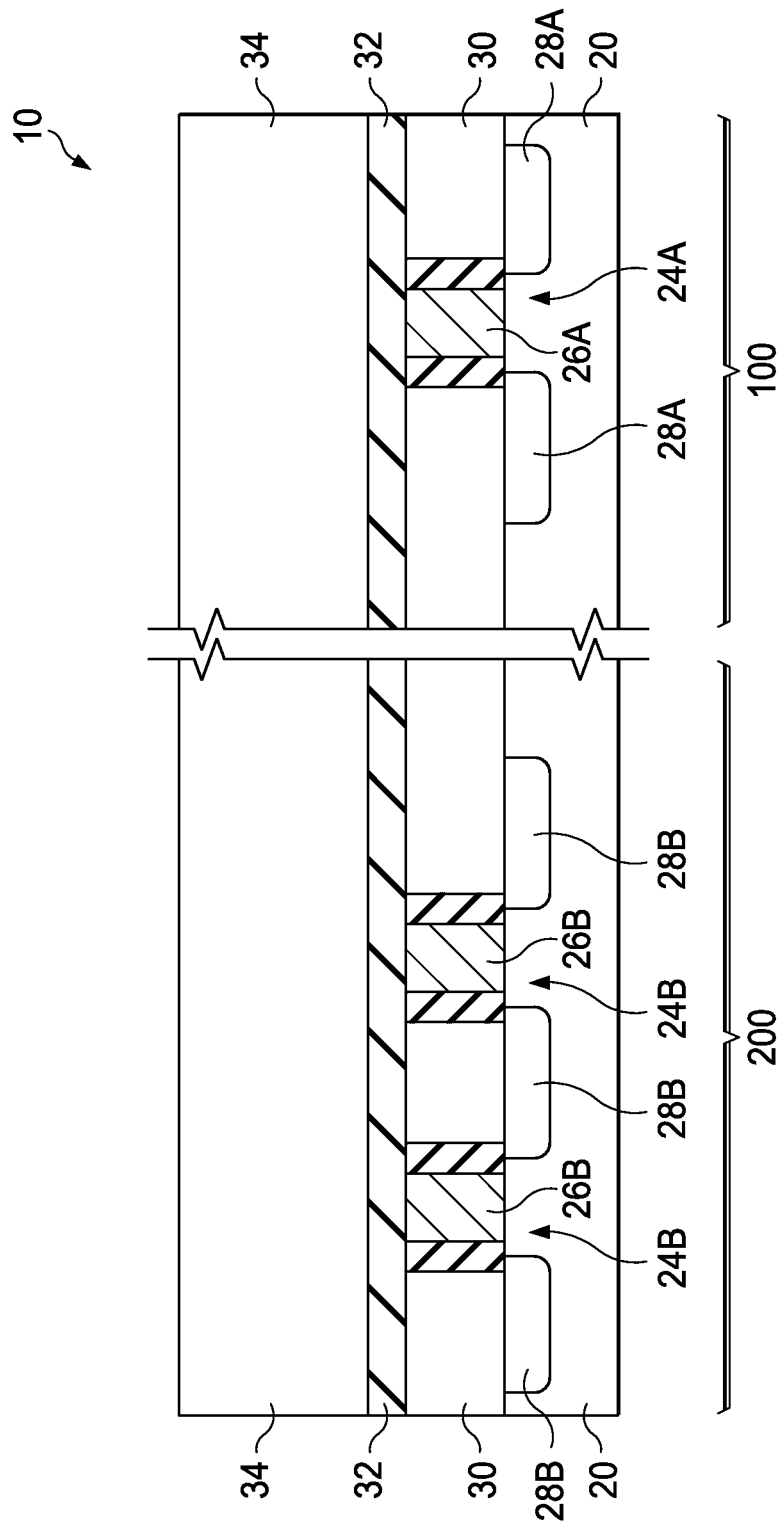
FIGS. 1 through 7 are cross-sectional views of intermediate stages in the manufacturing of contact plugs in accordance with various embodiments.

Referring to FIG. 1, wafer 10 is provided, and the features as illustrated in FIG. 1 are formed. Wafer 10 includes substrate 20, which may be formed of a commonly used semiconductor materials such as silicon, silicon germanium, silicon carbon, or the like. Substrate 20 may be a bulk substrate or a semiconductor-on-insulator (SOI) substrate. Metal-oxide-semiconductor (MOS) devices (transistors) 24 (which include transistors 24A and 24B) are formed at a surface of substrate 20. Transistor 24A is formed in pattern-scarce region 100, and transistors 24B are formed in pattern-dense region 200, wherein a first pattern density of transistors 24B in pattern-dense region 200 is greater than a second pattern density of transistors 24A in pattern-scare region 100, for example. In an exemplary embodiment, the first density is greater than the second density by greater than about 15 percent, or greater than about 30 percent. As a result, pattern-dense region 200 also has a higher pattern density of contact plugs than pattern-scare region 100, wherein the contact plugs are used to electrically coupled to gate electrodes 26A and 26B and source and drain regions (referred to as source/drain regions hereinafter) 28A and 28B.

Transistor 24A includes gate electrode 26A and source/drain regions 28A. Transistors 24B includes gate electrodes 26B and source/drain regions 28B. Although not shown, source/drain silicides may be formed as top portions of source/drain regions 28A and 28B. Gate electrodes 26A and 26B may be metal gates that are formed of metal(s) or metal alloy(s), although they may also be formed of polysilicon, metal silicides, or the like. Gate electrodes 26A and 26B are formed in inter-layer dielectric (ILD, referred to as ILD0 hereinafter) 30, wherein ILD0 30 may be formed of an oxide such as phospho-silicate glass (PSG), boro-silicate glass (BSG), boron-doped phospho-silicate glass (BPSG), tetra-ethyl orthosilicate (TEOS), or the like. In an embodiment, gate electrodes 26A and 26B are formed using a gate-last approach, although the gate-first approach is also usable. As a result, the top surface of gate electrodes 26A and 26B may be level with the top surface of ILD0 30.

Etch stop layer 32 is formed over, and may be in physical contact with, the top surfaces of gate electrodes 26A/26B and ILD0 30. In an embodiment, etch stop layer 32 is formed of silicon nitride. Alternatively, other dielectric materials such as silicon carbide, silicon oxynitride, or the like, may be used. The thickness of etch stop layer 32 may be between about 30 Å and about 250 Å. It is realized, however, that the dimensions recited throughout the description are merely examples, and may be changed to different values. Sacrificial layer 34 is formed over, and may, or may not, be in physical contact with etch stop layer 32. Sacrificial layer 34 may be formed of an oxide such as PSG, BSG, BPSD, TEOS, an oxide formed using chemical vapor deposition (CVD), or the like. Alternatively, sacrificial layer 34 may be formed of other materials such as low-k dielectric materials. The thickness of sacrificial layer 34 may be between about 200 Å and about 1,000 Å, although different thicknesses may be used.

Figure 2:
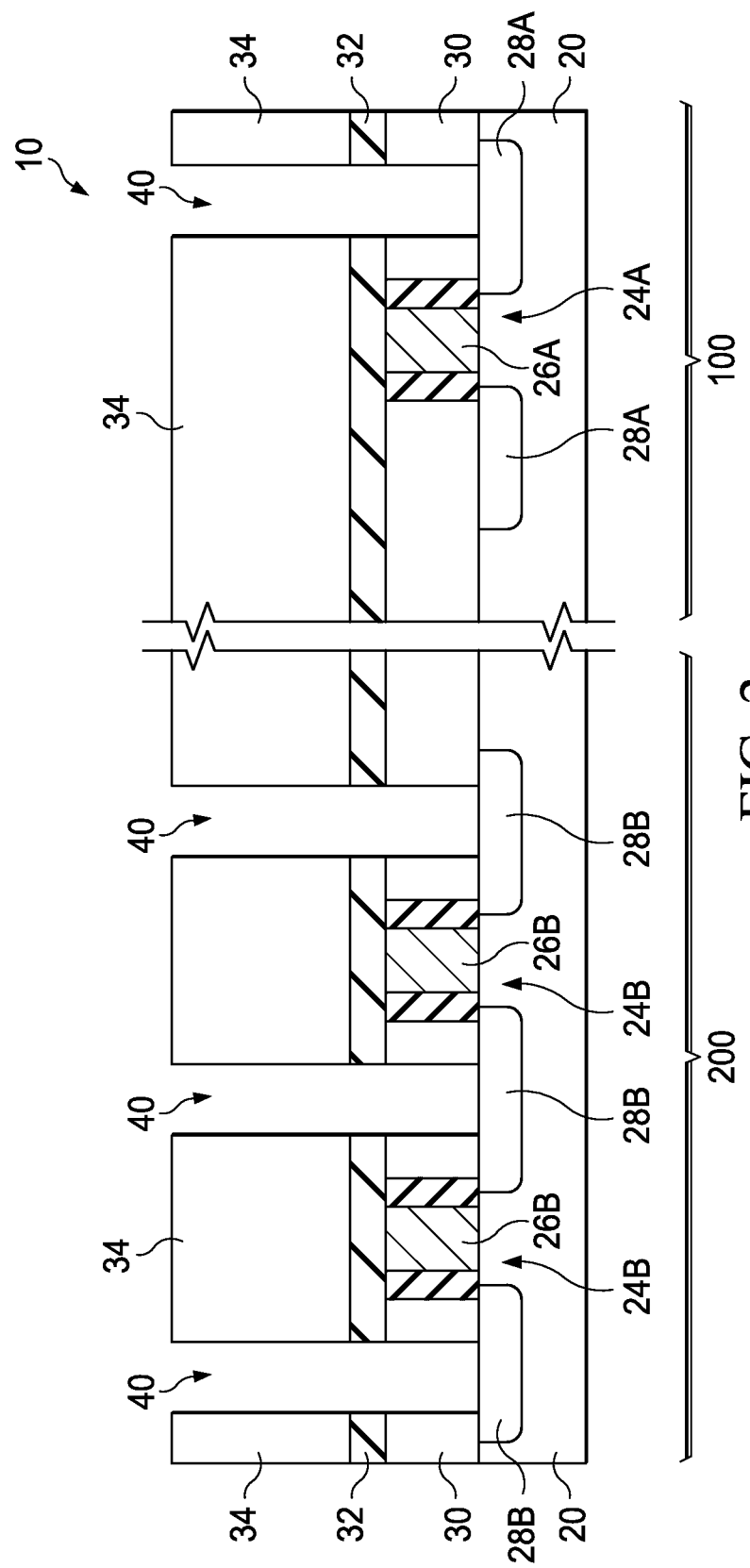
Figure 3:
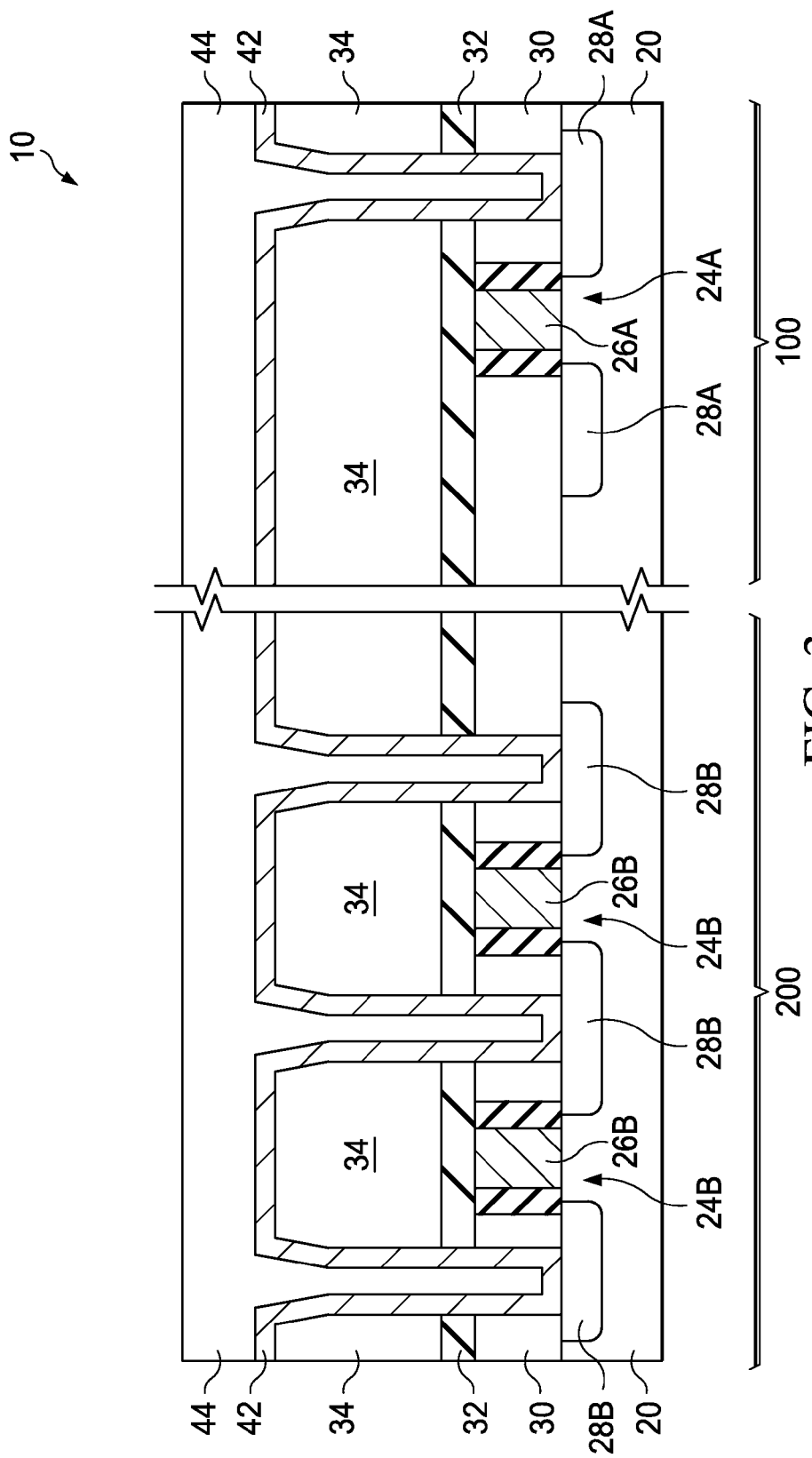

Referring to FIG. 2, openings 40 are formed by etching into sacrificial layer 34, etch stop layer 32, and ILD0 30. Accordingly, source/drain regions 28A and 28B may be exposed through openings 40. In the embodiment wherein the top portions of source/drain regions 28A and 28B are silicide regions, the silicide regions are exposed through openings 40. Next, as shown in FIG. 3, adhesion/barrier layer (also sometimes referred to as a glue layer) 42 is formed at the bottom and on the sidewalls of openings 40, and over the top surface of sacrificial layer 34. Metallic material 44 is then filled into the remaining portions of openings 40. In an embodiment, adhesion/barrier layer 42 is formed of a material selected from titanium, titanium nitride, tantalum, tantalum nitride, combinations thereof, or multi-layers thereof. Metallic material 44 may be formed of tungsten or a tungsten alloy, for example. Metallic material 44 may be filled to a level, and the top surface of metallic material 44 is higher than the top surface of sacrificial layer 34.

Figure 4:
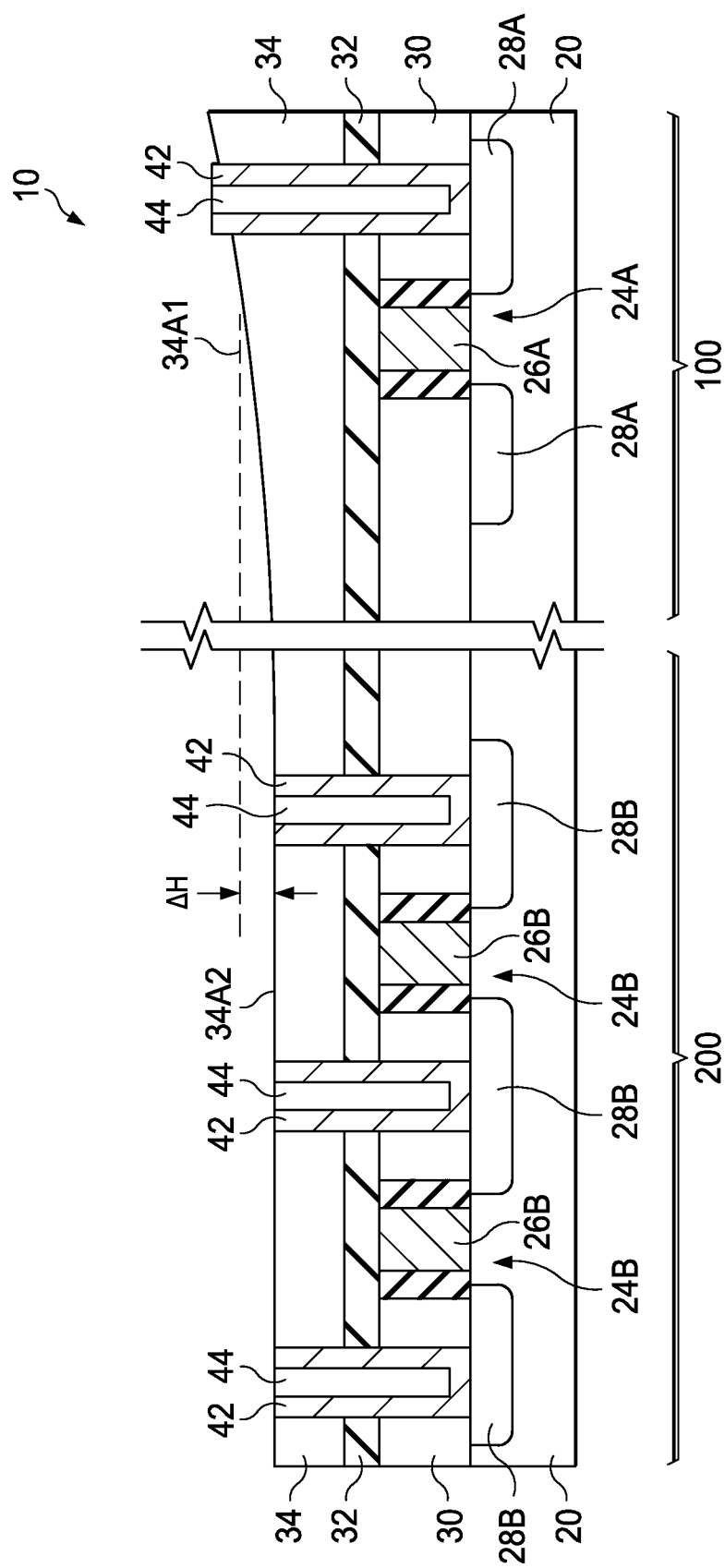

Referring to FIG. 4, a first chemical mechanical polish (CMP) process is performed to polish metallic material 44, adhesion/barrier layer 42, and sacrificial layer 34. During the first CMP process, the portions of metallic material 44 over the top surface of sacrificial layer 34, the horizontal portion of adhesion/barrier layer 42, and a top layer of sacrificial layer 34 are polished. In the first CMP process, the respective slurry (referred to as a first slurry hereinafter) may have ratio R34/R44 being smaller than 1, wherein value R44 is the polishing rate of metallic material 44 using the first slurry, and value R34 is the polishing rate of sacrificial layer 34 using the first slurry. Ratio R34/R44 may also be smaller than about 0.1, and may be between about 0.05 and about 0.2. In an exemplary embodiment, the first slurry comprises a tungsten rate booster, an etch inhibitor, and the like.

The first CMP process is stopped before etch stop layer 32 is exposed, and hence a bottom layer of sacrificial layer 34 remains in both pattern-scare region 100 and pattern-dense region 200. In an embodiment, at the time the first CMP process is stopped, an entirety of etch stop layer 32 is still covered by the remaining portion of sacrificial layer 34. Since polishing rate R44 is greater than polishing rate R34, in pattern-dense region 200, more sacrificial layer 34 and metallic material 44 are removed than in pattern-scare region 100. Accordingly, top surface 34A1 of the portion of sacrificial layer 34 in pattern-scare region 100 is higher than top surface 34A2 of the portion of sacrificial layer 34 in pattern-dense region 200. In an embodiment, at the time the first CMP process is stopped, the height different ΔH between top surfaces 34A1 and 34A2 may be greater than about 390 Å, for example.

Figure 5:
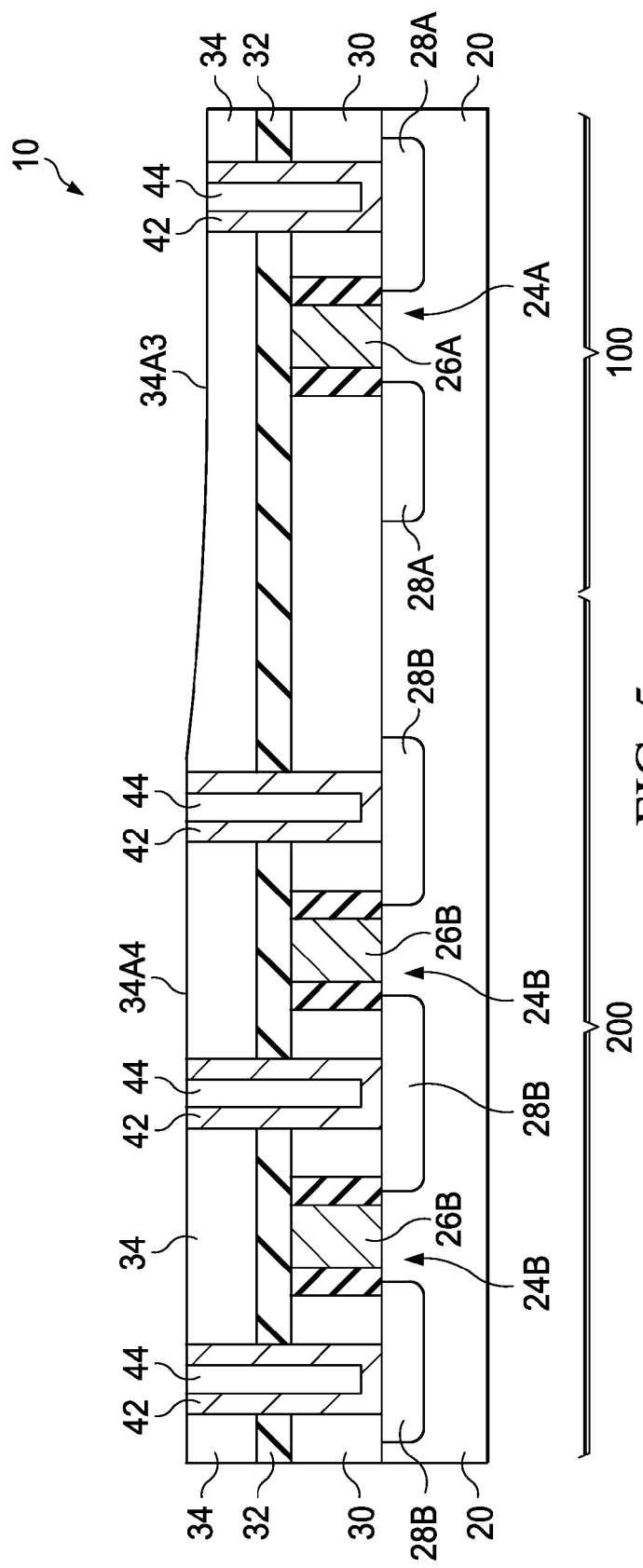

Referring to FIG. 5, after the first CMP process is stopped, a second CMP process is performed using a second slurry different from the first slurry. In the second CMP process, the second slurry may have ratio R34'/R44' greater than 1, wherein value R44' is the polishing rate of metallic material 44 using the second slurry, and value R34' is the polishing rate of sacrificial layer 34 using the second slurry. Ratio R34'/R44' may also be greater than about 1.5, and may be between about 2 and about 8. In an exemplary embodiment, the second slurry comprises an etch inhibitor, a SiN rate inhibitor, and the like.

The second CMP process re-balances the top surfaces of the portions of sacrificial layer 34 in pattern-dense region 200 and pattern-scare region 100. As a result, the height difference between top surface 34A4 of sacrificial layer 34 in pattern-dense region 200 and top surface 34A3 of sacrificial layer 34 in pattern-scare region 100 is reduced, and may be substantially eliminated after the second CMP process is performed for a period of time.

Figure 6:
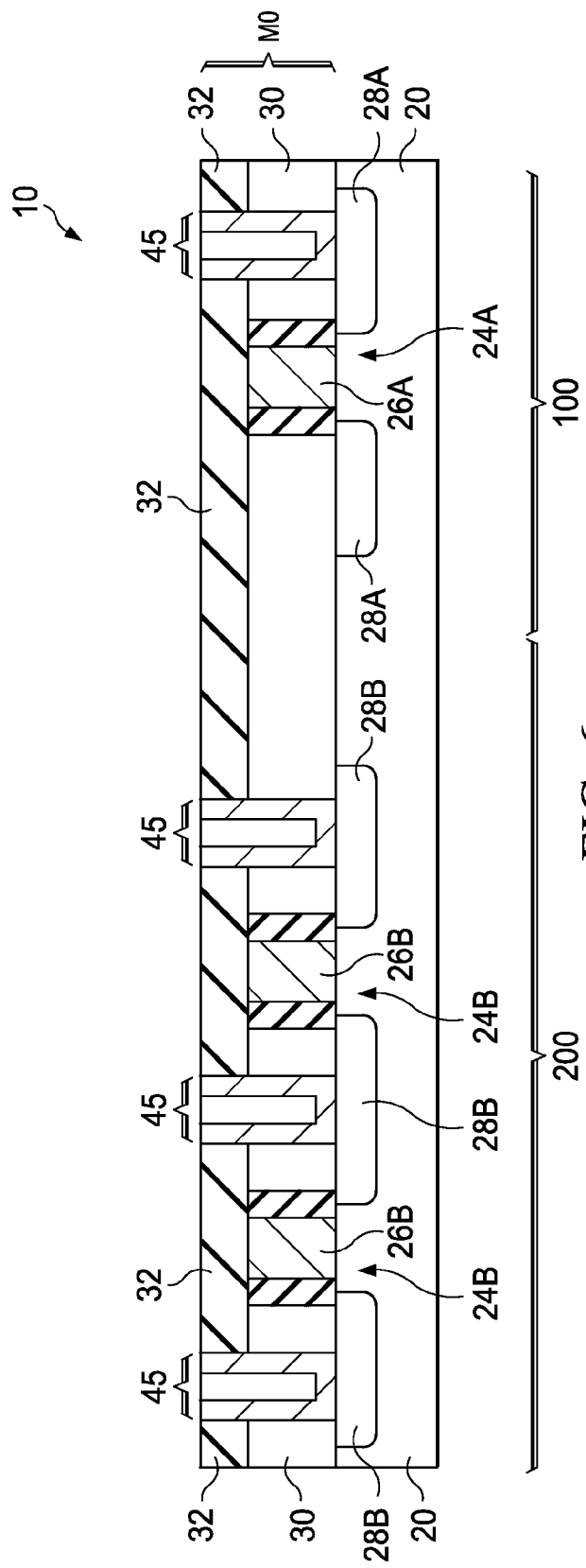

The durations of the first and the second CMP processes are adjusted, so that the portions of sacrificial layer 34 are fully removed from pattern-dense region 200 and pattern-scare region 100 substantially simultaneously. Furthermore, the second slurry is also selected so that the polishing rate of etch stop layer 32 is low, and hence etch stop layer 32 is used as an effective CMP stop layer for the second CMP process, and sacrificial layer 34 may be fully removed without causing significant damage to etch stop layer 32. The resulting structure is shown in FIG. 6. In the resulting structure, the remaining portions of adhesion/barrier layer 42 and metallic material 44 form contact plugs (sometimes referred to as M0_OD1) 45.

In above-discussed embodiments, the first CMP process (which has ratio R34/R44 being smaller than 1) is performed before the second CMP process (which has ratio R34'/R44' being greater than 1). In alternative embodiments, the sequence of the first and the second CMP processes may be inversed, and the first CMP process that has ratio R34/R44 being smaller than 1 may be performed after the second CMP process (that has ratio R34'/R44' being greater than 1) is finished.

Figure 7:
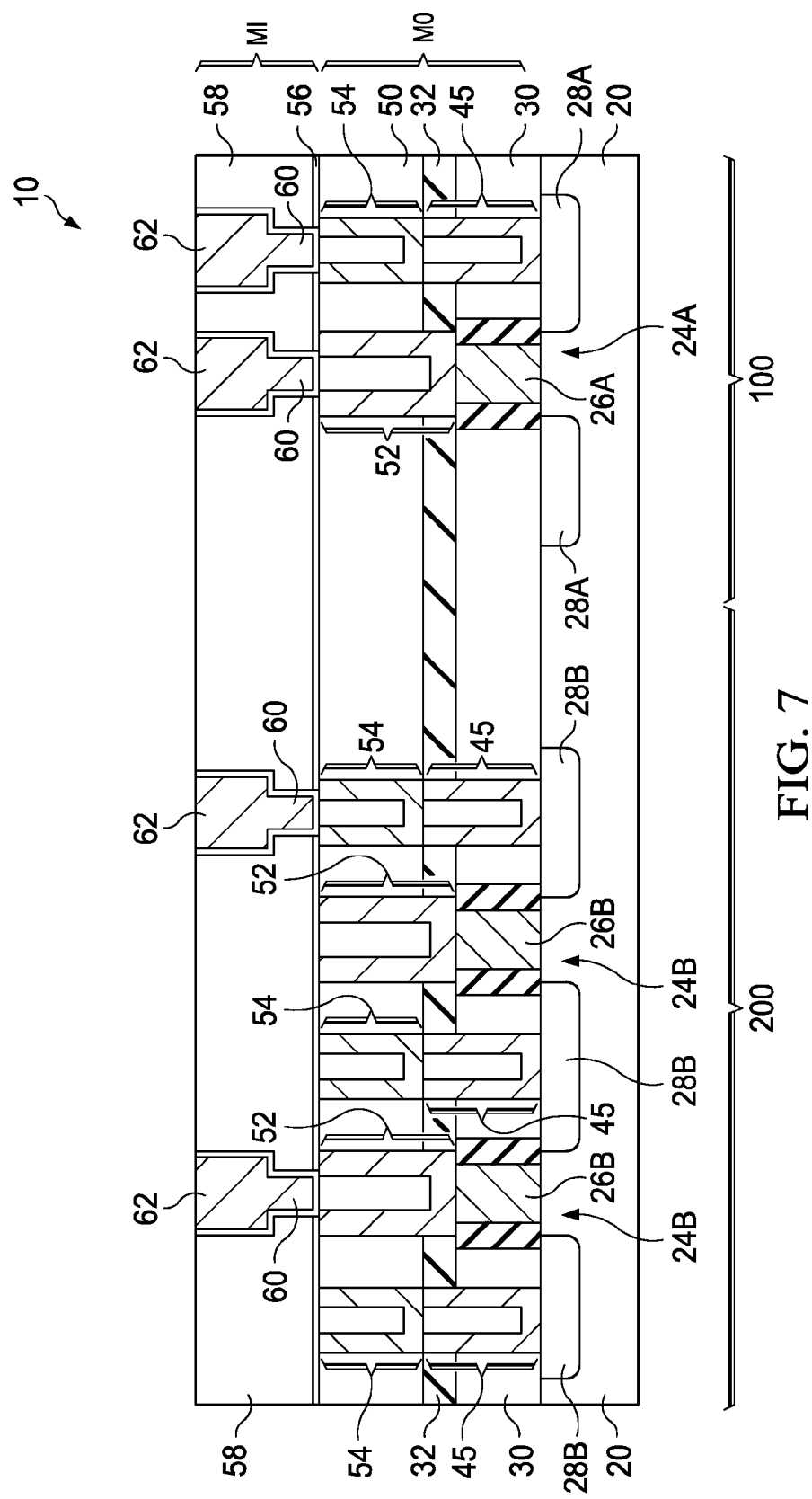

FIG. 7 illustrates the structure after the formation of ILD1 50, contact plugs 52 (sometimes referred to as M0_poly since they are directly over and connected to gate electrodes 26A and 26B), contact plugs 54 (sometimes referred to as M0_OD2 since they are directly over and connected M0_OD1 45). Contact plugs 52 and 54 are formed in ILD1 50, wherein contact plugs 52 are electrically coupled to, and may be in physical contact with, gate electrodes 26A and/or 26B, and contact plugs 54 are electrically coupled to, and may be in physical contact with, M0_OD1 45. The formation process may include forming ILD1 50, etching ILD1 50 to form openings, filling the openings with an adhesion/barrier layer and a metallic material such as tungsten or copper, and performing a CMP.

In subsequent process, etch stop layer 56, M0 vias 60, and metal lines 62 are formed in bottom metal layer M1. M0 vias 60 and metal lines 62 are formed in dielectric layer 58, wherein dielectric layer 58 may be formed of a low-k dielectric material having a k value smaller than about 3.0, or smaller than about 2.5, for example. In some embodiments, M0 vias 60 and metal lines 62 are formed using a dual-damascene process, and hence no noticeable interfaces are formed between M0 vias 60 and the respective overlying metal lines 62. In alternative embodiments, M0 vias 60 may be formed using a single-damascene process, and metal lines 62 may also be formed using a single-damascene process. In yet other embodiments, M0 vias 60 are not formed, while metal lines 62 are in contact with contact plugs 52 and 54. In subsequent process, more metal layers (not shown) may be formed over metal layer M1. M0 vias 60 and metal lines 62 may include a diffusion barrier layer and a copper-containing material over the diffusion barrier layer.

In the embodiments, by forming sacrificial layer 34 (FIGS. 3 through 5), and using the sacrificial layer 34 to re-balance the non-symmetry of the polishing rates in pattern-scarce region 100 and pattern-dense region 200, the CMP rates of metallic material 44 in pattern-dense region 200 and pattern-scare region 100 may be balanced, and the damage to etch stop layer 32 may be reduced. Experiment results indicated that by using sacrificial layer 34, the height difference between the heights of M0_OD1 contact plugs 45 (FIG. 6) in pattern-dense region 200 and pattern-scare region 100 may be reduced to about 16 Å across a wafer. As a comparison, if no sacrificial layer 34 is used, the height difference may be as much as about 337 Å. This will cause significant damage to etch stop layer 34, and a significant increase in the leakage from M0_poly 52 (FIG. 7) to substrate 20.

In accordance with embodiments, a method includes forming an etch stop layer over and contacting a gate electrode of a transistor, forming a sacrificial layer over the etch stop layer, and etching the sacrificial layer, the etch stop layer, and an inter-layer dielectric layer to form an opening. The opening is then filled with a metallic material. The sacrificial layer and excess portions of the metallic material over a top surface of the etch stop layer are removed using a removal step including a CMP process. The remaining portion of the metallic material forms a contact plug.

In accordance with other embodiments, a method includes forming an etch stop layer over and contacting a first gate electrode of a first transistor and a second gate electrode of a second transistor. The first and the second transistors are located in a pattern-dense region and a pattern-scarce region of a wafer, respectively. The method further includes forming a sacrificial layer over the etch stop layer, etching the sacrificial layer, the etch stop layer, and an inter-layer dielectric layer under the etch stop layer to form a first opening and a second opening. A first source/drain region of the first transistor and a second source/drain region of the second transistor are exposed through the first and the second openings, respectively. The first and the second openings are filled with a metallic material. A first and a second CMP process is performed to remove the sacrificial layer and excess portions of the metallic material over a top surface of the etch stop layer, and to form a first and a second contact plug in the first and the second openings, respectively. In the first CMP process, a first polishing rate for polishing the metallic material is greater than a second polishing rate for polishing the sacrificial layer. In the second CMP process, a third polishing rate for polishing the metallic material is smaller than a fourth polishing rate for polishing the sacrificial layer.

In accordance with yet other embodiments, a method includes forming an etch stop layer over and contacting a first gate electrode of a first transistor and a second gate electrode of a second transistor. The first and the second transistors are located in a pattern-dense region and a pattern-scarce region of a wafer, respectively. The method further includes forming a sacrificial layer over the etch stop layer, and etching the sacrificial layer, the etch stop layer, and an inter-layer dielectric layer under the etch stop layer to form a first and a second opening. A first source/drain region of the first transistor and a second source/drain region of the second transistor are exposed through the first and the second openings, respectively. The first and the second openings are filled with a metallic material. A first CMP process is performed to remove a top layer of the sacrificial layer. The first CMP process is then stopped. At a time the first CMP process is stopped, a first top surface of a first portion of the sacrificial layer in the pattern-dense region is lower than a second top surface of a second portion of the sacrificial layer in the pattern-scarce region. After the first CMP process is stopped, a second CMP process is performed to remove a bottom layer of the sacrificial layer and to form a first and a second contact plug in the first and the second openings, respectively. In the second CMP process, the sacrificial layer in the pattern-dense region has a first polishing rate smaller than a second polishing rate for polishing the sacrificial layer in the pattern-scarce region.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    forming an etch stop layer over and contacting a gate electrode of a transistor;
    forming a sacrificial layer over the etch stop layer;
    etching the sacrificial layer, the etch stop layer, and an inter-layer dielectric layer underlying the etch stop layer to form an opening;
    filling the opening with a conductive material; and
    removing the sacrificial layer and excess portions of the conductive material over a top surface of the etch stop layer, wherein the step of removing comprises a first chemical mechanical polish (CMP) process, wherein a remaining portion of the conductive material forms a first contact plug, and wherein during the first CMP process, a first polishing rate for polishing the conductive material is greater than a second polishing rate for polishing the sacrificial layer.

2. The method of claim 1, wherein the step of removing further comprises a second CMP process, and wherein during the second CMP process, a third polishing rate for polishing the conductive material is smaller than a fourth polishing rate for polishing the sacrificial layer.

3. The method of claim 2, wherein a ratio of the fourth polishing rate to the third polishing rate is between about 2 and about 8.

4. The method of claim 2, wherein the first CMP process has a greater polishing rate in a pattern-dense region of a wafer than a pattern-scarce region of the wafer, with the transistor being located in the wafer, and wherein a transistor density in the pattern-dense region is greater than a transistor density in the pattern-scarce region.

5. The method of claim 2, wherein at a time between the first and the second CMP processes, an entirety of the etch stop layer is covered by a remaining portion of the sacrificial layer.

6. The method of claim 1 further comprising:
    after the step of removing the sacrificial layer, forming an additional inter-layer dielectric over the etch stop layer; and
    forming a second and a third contact plug in the additional inter-layer dielectric, wherein the second and the third contact plugs are in contact with the gate electrode and the first contact plug, respectively.

7. The method of claim 1, wherein the sacrificial layer comprises an oxide.

8. A method comprising:
    forming an etch stop layer over and contacting a first gate electrode of a first transistor and a second gate electrode of a second transistor, wherein the first and the second transistors are located in a pattern-dense region and a pattern-scarce region of a wafer, respectively;
    forming a sacrificial layer over the etch stop layer;
    etching the sacrificial layer, the etch stop layer, and an inter-layer dielectric layer under the etch stop layer to form a first opening and a second opening, wherein a first source/drain region of the first transistor and a second source/drain region of the second transistor are exposed through the first and the second openings, respectively;
    filling the first and the second openings with a metallic material; and
    performing a first and a second chemical mechanical polish (CMP) process to remove the sacrificial layer and excess portions of the metallic material over a top surface of the etch stop layer, and to form a first and a second contact plug in the first and the second openings, respectively, wherein during the first CMP process, a first polishing rate for polishing the metallic material is greater than a second polishing rate for polishing the sacrificial layer, and wherein in the second CMP process, a third polishing rate for polishing the metallic material is smaller than a fourth polishing rate for polishing the sacrificial layer.

9. The method of claim 8, wherein a ratio of the fourth polishing rate to the third polishing rate is between about 2 and about 8.

10. The method of claim 8, wherein the first CMP process has a greater polishing rate in the pattern-dense region of the wafer than in a pattern-scarce region of the wafer.

11. The method of claim 8, wherein at a time between the first and the second CMP processes, an entirety of the etch stop layer is covered by a remaining layer of the sacrificial layer.

12. The method of claim 8 further comprising:
after the first and the second CMP processes, forming an additional inter-layer dielectric over the etch stop layer; and
forming a third and a fourth contact plug in the additional inter-layer dielectric and in contact with the first and the second contact plugs, respectively.

13. The method of claim 8, wherein the sacrificial layer comprises an oxide, and wherein the etch stop layer comprises silicon nitride.

14. A method comprising:
forming an etch stop layer over and contacting a first gate electrode of a first transistor and a second gate electrode of a second transistor, wherein the first and the second transistors are located in a pattern-dense region and a pattern-scarce region of a wafer, respectively;
forming a sacrificial layer over the etch stop layer;
etching the sacrificial layer, the etch stop layer, and an inter-layer dielectric layer under the etch stop layer to form a first and a second opening, wherein a first source/drain region of the first transistor and a second source/drain region of the second transistor are exposed through the first and the second openings, respectively;
filling the first and the second openings with a metallic material;
performing a first chemical mechanical polish (CMP) process to remove a top layer of the sacrificial layer;
stopping the first CMP process, wherein at a time the first CMP process is stopped, a first top surface of a first portion of the sacrificial layer in the pattern-dense region is lower than a second top surface of a second portion of the sacrificial layer in the pattern-scarce region; and
after the first CMP process is stopped, performing a second CMP process to remove a bottom layer of the sacrificial layer and to form a first and a second contact plug in the first and the second openings, respectively, wherein in the second CMP process, the sacrificial layer in the pattern-dense region has a first polishing rate smaller than a second polishing rate for polishing the sacrificial layer in the pattern-scarce region.

15. The method of claim 14, wherein in the second CMP process, a ratio of the second polishing rate to the first polishing rate is between about 2 and about 8.

16. The method of claim 14, wherein at a time the second CMP process is stopped, an entirety of the sacrificial layer in the pattern-dense region and an entirety of the sacrificial layer in the pattern-scarce region are fully removed.

17. The method of claim 14, wherein at a time between the first and the second CMP processes, an entirety of the etch stop layer is covered by a remaining portion of the sacrificial layer.

18. The method of claim 14 further comprising:
after the first and the second CMP processes, forming an additional inter-layer dielectric over the etch stop layer; and
forming a third and a fourth contact plug in the additional inter-layer dielectric and in contact with the first and the second contact plugs, respectively.

19. The method of claim 14, wherein the sacrificial layer comprises an oxide.

20. The method of claim 14, wherein the etch stop layer comprises silicon nitride.

* * * * *